United States Patent [19]
Prince et al.

[11] Patent Number: 5,605,759
[45] Date of Patent: Feb. 25, 1997

[54] PHYSICAL VAPOR DEPOSITION OF DIAMOND-LIKE CARBON FILMS

[76] Inventors: Robert Prince, R.R. #3, Stouffville, Ontario, Canada, L4A 7X4; Elisa Bourdon, #8 Apsco Avenue, Scarborough, Ontario, Canada, M1E 5A8

[21] Appl. No.: 321,548

[22] Filed: Oct. 12, 1994

Related U.S. Application Data

[62] Division of Ser. No. 821,416, Jan. 14, 1992, Pat. No. 5,366,556.

[51] Int. Cl.$^6$ ........................................ B05D 3/06
[52] U.S. Cl. ..................... 428/408; 427/596; 427/249; 427/122
[58] Field of Search .................. 427/596, 249, 427/122; 428/408

[56] References Cited

U.S. PATENT DOCUMENTS

| | | | |
|---|---|---|---|
| 4,663,183 | 5/1987 | Ovshinsky et al. | 427/39 |
| 4,948,629 | 8/1990 | Hacker et al. | 423/446 |
| 5,098,737 | 3/1992 | Collins et al. | 427/122 |

OTHER PUBLICATIONS

Sato et al. Jpn. J. Appl. Phys. vol. 26, No. 9, Sep. 1987 pp. L1487–1488.

*Primary Examiner*—Roy V. King
*Attorney, Agent, or Firm*—Falk, Vestal & Fish; Ron Fish

[57] ABSTRACT

A process for forming diamond like films of carbon on substrates at room temperature using physical vapour deposition. A source of carbon is physically ablated in the vicinity of a substrate to deposit on the substrate all forms of carbon. A physical discrimination process is applied continuously to remove graphite grains while leaving the aliphatic diamond form intact. The source of carbon is typically a high purity carbon rod. The substrate is typically metal or glass placed within about 60 centimeters where laser pulse energy of 50 millijoules peak power is used. Physical ablation is carried out by ion beam, arc or laser ablation. The resulting carbon plume impinges on the substrate and is thermally quenched. Physical discrimination between carbon forms is by using a laser having a wavelength which is absorbed by graphitic forms but which passes through the aliphatic forms without absorption thereby allowing thermal quenching of the diamond like aliphatic forms. Laser power is adjusted such that the optical removal rate of graphitic forms exceeds the arrival rate. Two laser beams are utilized either by two lasers or by one by suitable optical imaging. Multiple physical configurations exist to use either one or two lasers.

11 Claims, 4 Drawing Sheets

PHYSICAL VAPOR DEPOSITION OF DIAMOND-LIKE CARBON FILMS

This is a divisional application under 37 C.F.R. 1.60 of a U.S. patent application having Ser. No. 07/821,416, filed Jan. 14, 1992 for: PROCESS AND APPARATUS FOR PRODUCTION OF DIAMOND-LIKE FILMS, now U.S. Pat. No. 5,366,556.

FIELD OF THE INVENTION

This invention relates in general to vapour deposition processes and more particularly to a process and apparatus for production of diamond-like films using physical vapour deposition.

BACKGROUND OF THE INVENTION

Although hardness and resistance to wear are the most commonly known industrial applications of the unique properties of diamond, it is likely that future applications will utilize the electronic and optical properties of this material. The rarity of the natural gemstone indicates that the supply from this source is grossly insufficient to match the demand from the polishing, cutting and drilling industries. Furthermore, supplies of natural diamond are inadequate for the burgeoning semiconductor industry, which is expected to occupy 60% of the worldwide sales for diamond (projected at $985 million) by 1996.

The term "diamond-like carbon" (DLC) is generally applied to films of carbon that have properties that resemble, but do not match, those of true diamond. For many applications, however, the distinction is not important, and the ability to produce such coatings at substrate temperatures well below that needed for true diamond makes DLC useful for protective coatings and in some optical applications. These films are generally amorphous, though they may contain very small crystallites less than about 20 nm in size. DLC usually contains a level of hydrogen up to 50 atomic percent as a consequence of prior art chemical vapour deposition processes which use hydrocarbon/hydrogen gas mixtures.

Following an extensive investigation of the carbon phase diagram in the 1940s, the successful synthesis of artificial diamond was achieved in 1953 at ASEA in Sweden and in 1954 at General Electric in the United States. This method required both the high temperatures and high pressures which are characteristic of the natural process, but additionally included a metal solvent and catalyst to permit growth at reasonable rates. A disadvantage of this prior art process is that while the metallic impurity level resulting from such a catalyst is not significant from the point of view of mechanical applications, it is unacceptable for the optical and electronic applications which now represent the basis of the modern market expansion.

A second high pressure method to synthesize diamond was discovered in 1961, and was industrially developed by Du Pont. This method harnessed the high pressures in explosively-driven shock waves to initiate a direct conversion of graphite to diamond.

Both of the above-discussed prior art methods are capable of producing synthetic diamond grit for abrasive use at economical cost, although the inclusion of residual graphite, metals and carbides makes such products unsuitable for "gem quality" applications. Such synthetic forms are available (General Electric, Sumimoto Electric) with masses up to 2 carats (about 0.4 gram), or up to several millimetres in size, at about $150 per piece, although the majority do not find end-use in the jewelry market, but as heat sinks in the electronics industry. This rather surprising property of diamond is illustrated by the fact that in its purest form (only the isotope 12 present) diamond may exhibit a thermal conductivity up to ten times that of copper. Diamond-coated heat sinks are thus an attractive alternative, as are semiconductor devices based on diamond; in comparison to silicon, for operation at extreme temperatures wherein the switching of large power in small volumes is feasible.

In addition to the above methods of forming diamond by high pressure synthesis, several groups have investigated the preparation of low pressure (metastable) carbon forms, making use of chemical procedures to restrict the rate of conversion to the stable (graphitic) phase. For example, U.S. Pat. No. 3,030,188 (Eversole) and a paper by Derjaguin (Growth of Diamond and Graphite from the Gas Phase, in Russian) both report the formation of diamond from the gas phase decomposition of carbon-containing species such as carbon monoxide or hydrocarbons such as methane and acetylene. In both of these prior art processes, a "seed" crystal was used, on which both diamond and graphite were deposited. The process was interrupted to remove the undesired graphitic phase by preferential etching of the graphite, by heating in atmospheres of either hydrogen or oxygen. The deposition and etching cycles continued until a measurable mass had been accumulated.

The requirement for a suitable etchant continues in present research (e.g. usually atomic hydrogen is used), but the first to achieve deposition in a continuous cycle was J. C. Angus, who used a methane/hydrogen mixture at deposition rates low enough to prevent stable graphitic nuclei from forming, as described in U.S. Pat. No. 3,630,677. It was also demonstrated by Angus that boron doping could produce semiconducting diamond films.

By 1976, Spitzyn, Bouliov and Derjaguin demonstrated unmistakeable evidence of both large-faceted diamonds and continuous films, not only on diamond substrates, but on other materials as well (see B. V. Spitsyn, L. L. Bouiliov, B. V. Derjaguin, J. Cryst. Growth 52 (1981) 219. English version of above work published in a Russian language journal in 1976). The methods all involved a "super equilibrium" with diamond, either by catalysis, by a hot filament, or by an electrical discharge plasma, techniques which form the basis of present day methods albeit with modification in experimental parameters. For example, by the early 1980s, a group at NRIM in Japan deposited diamond films using a hot filament to produce dissociation of hydrogen in a methane-hydrogen mixture (see S. Matsumoto, Y. Sato, M. Kamo, N. Setaka, Jpn. J. Appl. Phys. 21 (1982) L183; M. Kamo, Y. Sato, S. Matsumoto, N. Setaka, J. Cryst. Growth 62 (1983) 642; and S. Matsumoto, J. Mat. Sci. Lett. 4 (1985) 600). Others have continued with alternative sources of atomic hydrogen such as radio-frequency and microwave-frequency plasmas. These methods are currently known as chemical vapour deposition (CVD), under the main categories of plasma-assisted CVD, thermally assisted (or "hot wire") CVD and reactive vapour deposition. The latter can be implemented simply using an oxyacetylene flame, or using a mix of halocarbon gas and hydrogen. Variations exist in which a bias voltage is applied between the hot filament and substrate to accelerate or repel charged gas phase species. In extreme cases, a glow discharge or direct-current plasma arc may be employed.

It has been discovered that the very rapid energy input available using modern pulsed lasers (typically up to 100 MW peak power) can potentially produce novel materials due to the non-equilibrium conditions created in the ablation of a source material. Additionally, there exists the possibility of photochemical processing of the resultant film. At the present time, lasers have been used principally as an alternative evaporative or thermal source of film material.

For example, in 1983 Fedoseev and Derjaguin reported a novel method of diamond synthesis which involved the exposure of a flowing loose powder of carbon black, in air, to a continuous wave carbon dioxide laser flux (see D. V. Fedoseev, V. L. Bukhovets, I. G. Varshavskaya, A. V. Lavrent'ev, B. V. Derjaguin, Carbon 21 (1983) 237; and D. V. Fedoseev, I. G. Varshavskaya, A. V. Lavrent'ev, B. V. Derjaguin, Powder Technology 44 (1985) 125). This simple treatment appeared to transform some fine carbon black particles to various high pressure phases, including diamond. Separation of the high pressure phases from the untransformed carbon black was achieved by physical and chemical methods, and diamond formation was verified by means of electron and X-ray diffraction. The mechanism for the transformation is not understood, although the authors speculated that the transformation of carbon black to diamond occurs because of the rapid heating and cooling of the particles. Since thermal equilibrium cannot occur on such a short timescale, it is presumed that the massive thermal stress occurring at high temperature results in the transformation, and that rapid cooling is similarly required to maintain the existence of such non-equilibrium products. Other materials have been studied by this technique, such as high pressure polymorphs of silica.

The use of laser ablation as a source of carbon vapour is known, although it is not as widespread as CVD methods. It may be used for the thermal evaporation of most elemental materials, technically important compounds such as high temperature super-conducting alloys, and others including cubic boron nitride. For example, pulsed laser ablation is the only technique known to yield heteroepitaxial boron nitride films on silicon. Direct laser etching of patterns in thin metallic and polymeric films has also been contemplated as an alternative to ion milling or photoresist masks. Laser etching has also been used for the trimming of passive components.

Both Cuomo and Collins have claimed the production of diamond and DLC films by means of the laser ablation of carbon in combination with modest or very high electrical bias to accelerate ionized species in the plasma plume to the substrate. (See (1) J. J. Cuomo, D. L. Pappas, J. Bruley, J. P. Doyle, K. L. Saenger, IBM Research Division, T. J. Watson Research Centre. Paper presented at Int. Conf. on Metallurgical Coatings and Thin Films, San Diego, April 1991. U.S. patent applied for.; and (2) R. A. Collins, Rice University, Texas. Paper presented at Diamond Film '90, Crans Montana, Switzerland, September 1990, published in Surface and Coatings Technology, June 1991 (in press). U.S. patent issued 1990).

The inventors in the present application have also investigated a variation of the above method, in which either a buffer (e.g. helium) or reactive gas (eg. hydrogen) is introduced at appropriate pressure between the ablation plume and the substrate. (See E. B. D. Bourdon, W. W. Duley, A. P. Jones, R. H. Prince, Surface and Coatings Technology, 47 (1991) 509.; E. B. D. Bourdon, R. H. Prince, Applied Surface Science 48/49 (1991) 50. By this means, the partial pressure of carbon is independent of the buffer gas mixture, hence the technique may be considered "additive" in the manner in which hydrogen is introduced, in contrast to CVD processes in which the carbon/hydrogen ratio is always limited by the feedstock hydrocarbon gas. Good quality clear DLC films have been produced by this approach, with optical gaps up to 3.5 eV (transmission to about 400 nm wavelengths). A distinct advantage over plasma-assisted CVD, for example, is the ability to deposit at low (e.g. room) temperatures on substrates such as plastics that would not survive the higher temperatures used in most CVD methods.

A recent development by Narayan et al is reported in J. Narayan, Science, March 1991. This method involves the alleged production of diamond crystals by laser irradiation of copper, previously implanted with high energy carbon ions. The method makes use of the very low solubility of carbon in copper, and the role of the laser is purely thermal, (i.e. for heating the carbon to high temperatures at high atomic density in the copper "host" matrix). Despite the close match in lattice constants between diamond and several transition metals and alloys, growth on such metals has been unsuccessful, presumably because of the high solubility and mobility of carbon in such cases. Copper appears to be a notable exception.

SUMMARY OF THE INVENTION

According to the present invention, a method of "physical" vapour deposition is utilized for the formation of diamond-like carbon. Specifically, the introduction of carbon and subsequent processing of the film is achieved by physical rather than chemical means as in CVD. Firstly, a source of carbon atoms is provided. Also, the source is physically ablated in the vicinity of a substrate such that a carbon film grows on the substrate through bonding in all possible forms (sp1, sp2, sp3). Next, a physical discrimination process is applied continuously during film growth for etching the graphite grains (sp2) off the carbon film while permitting the diamond (sp3) to remain, thereby resulting in a diamond-like film.

The physical vapour deposition process of the present invention offers a unique advantage over prior art CVD approaches in that growth of the diamond-like film may be undertaken at low (e.g. room) temperatures on substrates that would not survive higher temperatures used in most CVD methods. Alternatively, the substrate may be heated as in CVD to enhance growth rates.

In general, according to the present invention there is provided a process for production of diamond-like films comprising the steps of a) physically ablating a source of carbon in the vicinity of a substrate such that a carbon film grows on said substrate through bonding of carbon atoms in graphitic form and aliphatic form; and b) physically discriminating said carbon film during growth thereof by suppressing or etching said graphitic form within said carbon film while permitting said aliphatic form to remain thereby resulting in a diamond-like film.

According to another aspect of the invention there is provided an apparatus for the production of diamond-like films comprising a) a substrate; b) a source of carbon; c) means for physically ablating said source of carbon in the vicinity of said substrate such that a carbon film grows on said substrate through bonding of carbon atoms in graphitic form and aliphatic form; and d) means for physically discriminating said carbon film during growth thereof by suppressing or etching said graphitic form while permitting said aliphatic form to remain thereby resulting in a diamond-like film on said substrate.

BRIEF DESCRIPTION OF THE DRAWINGS

A detailed description of the preferred embodiments is provided herein below, with reference to the following drawings in which.

DETAILED DESCRIPTION OF THE PREFERRED EMBODIMENTS

Figure 1:
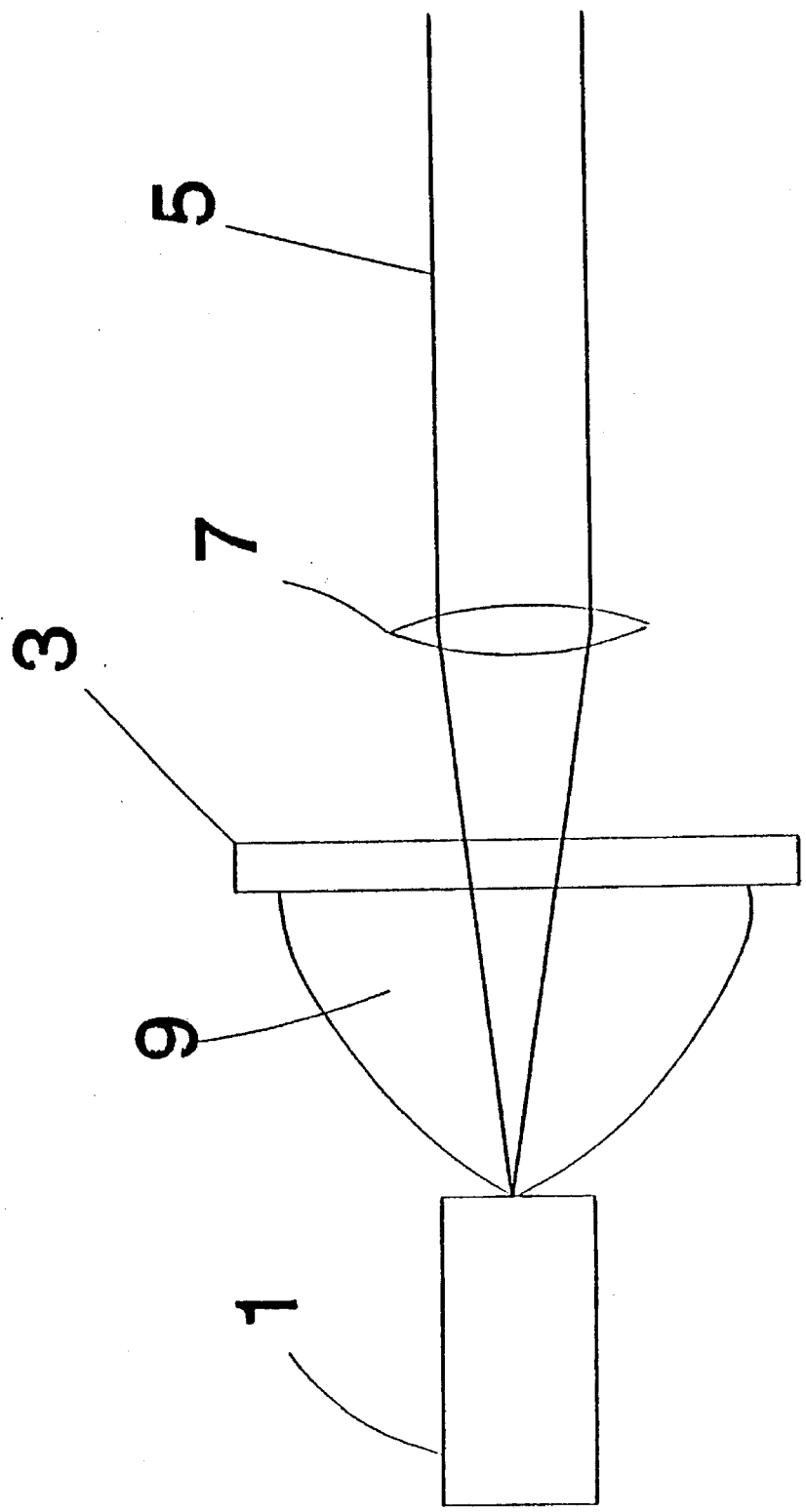
FIG. 1 shows an apparatus for the production of diamond-like films incorporating a single laser in transmission mode according to the present invention.

In the process of the present invention, a source of carbon must first be provided. According to the preferred embodiment, high purity carbon rod is utilized because of its case of handling in rod form and rotation during ablation. However, in principle, other carbonaceous substances can be employed as a feedstock, possibly including impure forms such as natural coal.

Next, a metallic, glass or other substrate is positioned close to the source of carbon at a distance which depends on the laser power utilized. Typical values are 60 cm at laser pulse energy of 50 mJ, peak power typically 100 MW.

The carbon source is then physically ablated in the vicinity of the substrate by means of an ion beam, arc, or preferably via laser ablation of the carbon solid. In response, a carbon plume of very high atomic densities is created (as high as 10 to 100 atmospheres) in the vicinity of the substrate. Carbon atoms in the plume impinge upon the substrate and are thermally quenched. The substantial translational kinetic energy provided in the hot plume initiates annealing and growth of a carbon film. More particularly, the atoms of the carbon film bond on the substrate in all possible forms (sp1, sp2, sp3) available to carbon. However, the distribution may be skewed towards the desired sp3 form (i.e. diamond) by manipulation of the evaporation parameters or by controlling the gaseous environment. For example, hydrogen (typically 10 Torr) may be added to form CH radical intermediates, such that the chemical etchant effect for graphite is then a subsidiary process that will increase the DLC film growth rate at the expense of purity.

As discussed above, discrimination of the carbon film is necessary in order to suppress or etch off the graphitic form of carbon atoms (sp2) from the film while permitting the aliphatic form (sp3) to remain. In prior art CVD processes, this has been achieved by chemical means (e.g. either atomic hydrogen, oxygen or halogen), for preferentially suppressing the kinetic growth of the undesired (graphitic) forms. According to the present invention, physical discrimination is additionally utilized. More particularly, an optical discrimination is applied continuously during film growth. The physical discrimination process of the present invention is based on the fact that at visible and near-UV wavelengths, graphite grains (sp2) are opaque, while diamond (sp3) is transparent, at least to wavelengths down to 200 nm which corresponds to the optical band gap of diamond (about 5.2 eV). As will be discussed in greater detail below, this characteristic may be utilized in the construction of apparatus for implementing the process of the present invention in which a single laser is utilized for both the deposition as well as physical discrimination steps. This is possible since the laser wavelengths utilized to ablate the graphite target (e.g. 308 nm produced via an XeCl laser) do so very efficiently, yet provided the focused power is not so large as to initiate multi-photon processes, the laser light will pass readily through a transparent substrate (e.g. quartz or fused silica having optical cut-off at approximately 200 nm).

Since the limiting level of graphite in the resultant film depends on the optical properties of graphite when in the form of very small grains, a determination must be made as to the grain size at which the graphite will no longer absorb at the laser wavelength in use. The optical band gap is known to monotonically increase as the size of graphitic grains (either clustered or linear) decreases. At the preferred wavelength of 308 nm (photon energy approximately 4 eV), the corresponding graphitic unit that will absorb the generated light is approximately 1 carbon ring in size. Therefore, in the absence of multiphoton processes, the 308 nm radiation applied for optical discrimination will produce a DLC film of at least 4 eV band gap, and with graphitic regions of no more than typically 1 carbon ring in size.

The physical discrimination process can be increased further by utilizing shorter wavelengths of light such as those available from other pulsed lasers such as (but not restricted to) the inert gas/halide excimer lasers KrCl (222 nm) KrF (248 nm), or ArF (193 nm) which correspond even more closely to the optical gap of pure diamond. However, the more stringent the threshold for the optical discrimination is made, the lower-the deposition rates of diamond film. Although, provided that the optical removal rate exceeds the arrival rate for graphite (by adjustment of laser ablation power) the film may be skewed towards the desired optical property of pure diamond.

Turning to FIGS. 1 to 4, the process of the present invention may be implemented using two laser beams generated by either one or two lasers. The first laser beam is utilized for carbon ablation and the second beam is utilized for optical discrimination. By utilizing two lasers, it is possible to independently control the two aspects of the process and thereby allow for optimization of production rates. Alternatively, the single laser implementation may be used by either passing the laser beam through the growing film before impinging on the ablation target, or by utilization of a beam splitter introducing a suitable fraction of the incident power to each of the ablation and discrimination functions. In the latter scenario, there exists some compromise relative to the dual laser implementation in terms of optimization. However, since the preferred wavelength of 308 nm corresponds to a graphitic component of only one molecular size, and since the desired wavelength has high ablation efficiency for carbon, the simplicity and cost advantages of the latter approach are evident.

Referring to FIG. 1, apparatus is shown for the production of diamond-like film from a carbon source 1 onto a substrate 3. The substrate 3 is positioned intermediate to the carbon source 1 and a laser beam 5 with associated collimating lens 7. In the embodiment shown, the substrate 3 must be optically transparent to the irradiating wavelength. The substrate 3 may be selected from the group of consisting of (but not restricted to) magnesium oxide, sapphire, silica, quartz, alkali-halides (i.e. "salt" crystals). The latter substrate selection provides unique advantages for the production of free-standing diamond films for use as optical windows, since the salt substrate may be easily dissolved after fabrication.

Upon irradiating the carbon source 1 with the laser beam 5, a hot carbon plume 9 is generated in the manner discussed above for initiating growth of a DLC film on the substrate 3.

In order to increase the area of the processed film, either the substrate 3 or the laser focal region (i.e. movement of lens 7) may be scanned by mechanical or other means.

Figure 2:
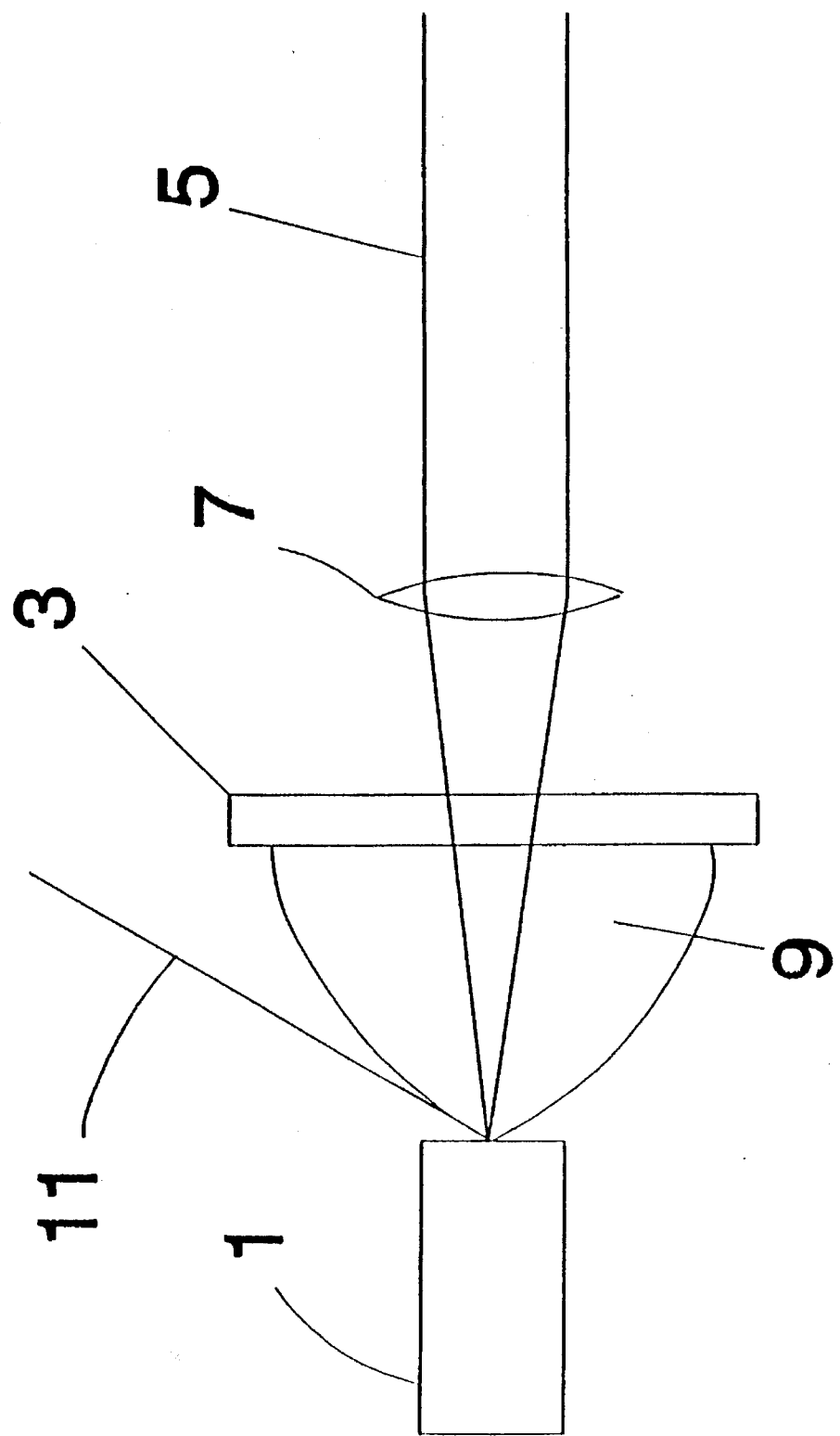
FIG. 2 shows a first alternative embodiment of apparatus for the production of diamond-like films using two lasers, both operating in transmission mode.

Turning to FIG. 2, a dual laser apparatus is shown in transmission mode wherein like reference numerals represent like elements as between FIGS. 1 and 2. However, in the apparatus of FIG. 2, the secondary laser beam 11 is used for ablation of the carbon source 1 while the primary laser beam 5 is used for physical discrimination. By utilizing two lasers, ablation and discrimination wavelengths may be independently controlled. As discussed above in relation to FIG. 1, either the substrate 3 may be moved or the processing laser may be spatially scanned via movement of collimating lens 7 in order to increase the effective film area. Furthermore, laser beam 5 may supply additional ablative power after transmission through substrate 3.

Figure 3:
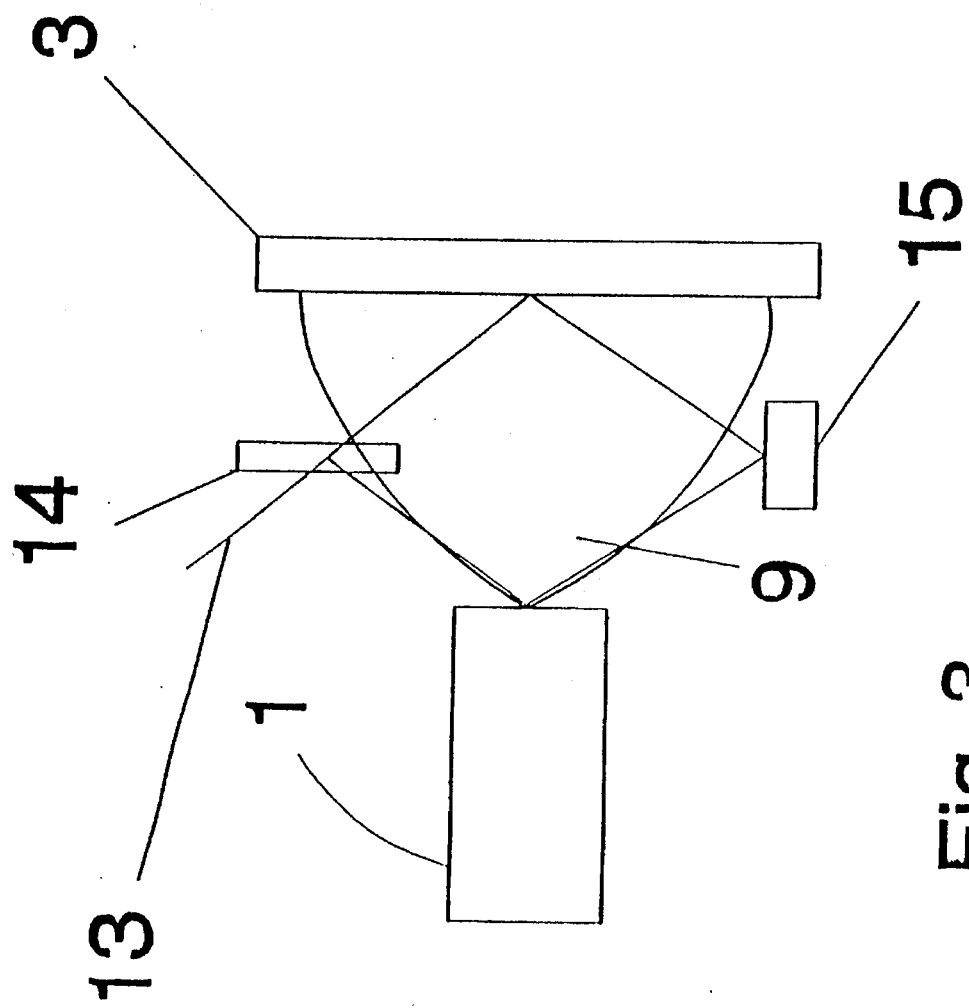
FIG. 3 shows a second alternative embodiment of apparatus for the production of diamond-like films using a single laser in reflection mode.

Turning to FIG. 3, a single laser beam 13 is shown operating in reflection mode, wherein the substrate 3 is either totally optically opaque (e.g. metallic) or non-transmitting at the wavelength used for processing (e.g. glass, narrow band semiconductors, etc.). A beam splitter 14 is used for splitting the beam 13 between the substrate 3 for physical discrimination and the carbon source 1 for ablation. The portion of the beam which impinges upon substrate 3 is reflected onto a mirror 15 and therefrom back to the carbon source 1 for further physical ablation. The mirror 15 and/or substrate 3 may be moved in a controlled manner to increase the processed film area.

Figure 4:
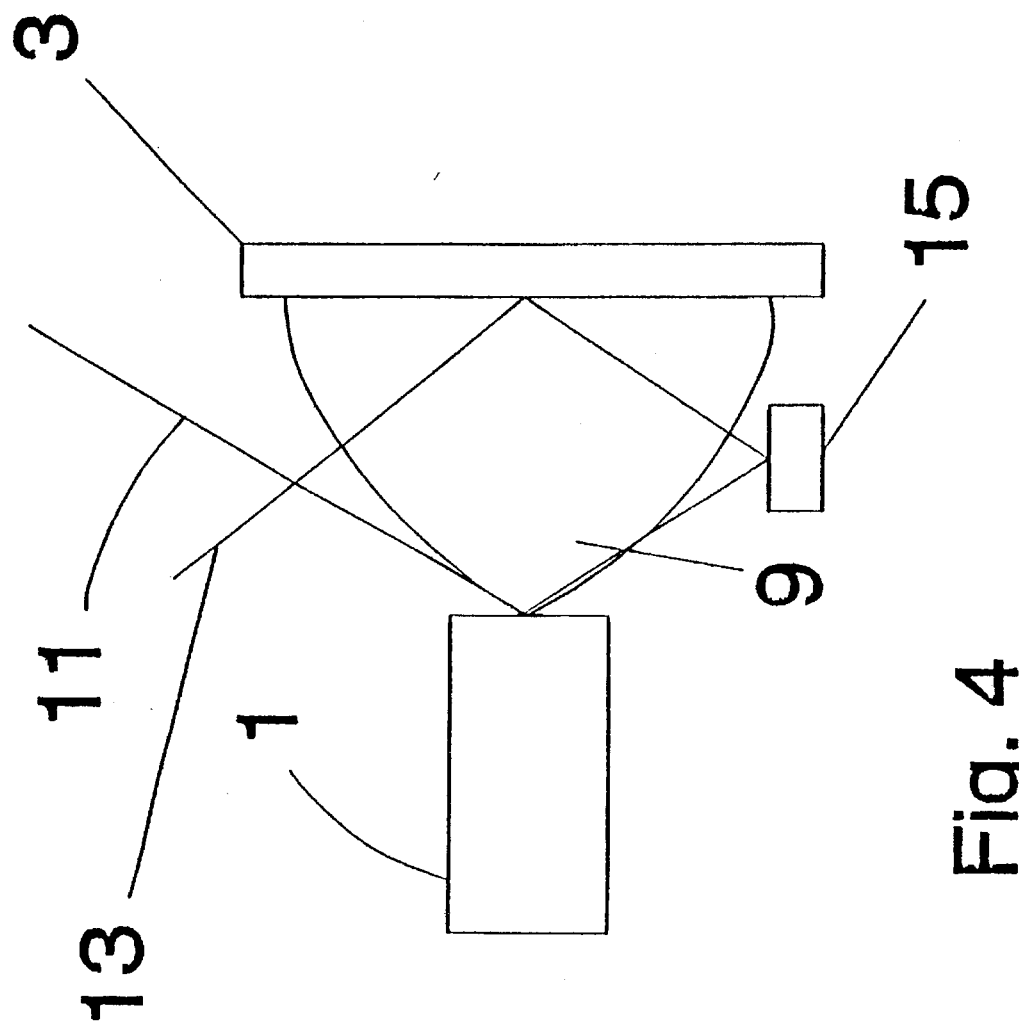
FIG. 4 shows a third alternative embodiment of apparatus for the production of diamond-like films comprising two lasers both operating in reflection mode.

In the embodiment of FIG. 4, dual laser beams are shown in reflective mode, with appropriate spatial scanning of the mirror 15 or substrate 3, as required.

In summary, the physical vapour deposition process of the present invention provides unique advantages over chemical vapour deposition in the growth of diamond-like films. For example, the precisely controlled environments (e.g. partial pressures of reactive gases, etc.) are avoided. Furthermore, the physical vapour deposition process of the present invention may be undertaken at low temperatures (e.g. room temperature) in contrast with prior art processes.

Modifications and variations of the present invention are possible. For example, a reactive background gas such as (but not limited to) hydrogen or oxygen may be included. As discussed above, the combination of physical and chemical discrimination methods (i.e. PVD plus CVD) may considerably enhance the production rate of the desired films, or lower the substrate temperatures currently required for acceptable growth rates by CVD. Since the optical discrimination method of the present invention does not require thermal activation as is required for chemical etching, growth rates at or just above room temperature are far more acceptable than with CVD alone. A residual benefit of utilizing hydrogen as a means for stabilizing the surface of the diamond film, is that the hydrogenated surfaces of diamond are known to have lower enthalpies of formation (at room temperature) than any of the hydrogenated surfaces of graphite.

All such embodiments and variations are believed to be within the sphere and scope of the present invention as defined in the claims appended hereto.

We claim:

1. A process for production of diamond-like carbon films having at least about 4 ev bandgap comprising the steps of:
    a) physically ablating a source of carbon in the vicinity of a substrate such that a carbon film grows on said substrate through bonding of carbon atoms in graphitic form and aliphatic form; and
    b) physically discriminating said carbon film during growth thereof by etching or supressing said graphitic form within said carbon film while permitting said aliphatic form to remain by optical discrimination applied continuously during film growth using pulsed UV laser light having a wavelength which is opaque to graphitic forms of carbon but transparent to aliphatic forms of carbon, thereby resulting in a diamond-like carbon film.

2. The process of claim 1 further including the step of introducing a reactive background gas for stabilizing said diamond-like carbon film during said steps of physically ablating and physically discriminating.

3. The process of claim 2 wherein said reactive background gas is hydrogen.

4. The process of claim 2 wherein said reactive background gas is oxygen.

5. The process of claim 1 wherein said step of physically ablating comprises impinging laser light on said source of carbon to form a carbon plume, wherein carbon atoms in said plume are thermally quenched at said substrate to initiate annealing of said carbon film.

6. The process of claim 1 wherein said step of physically discriminating comprises impinging laser light on said carbon film, said aliphatic form of carbon atoms being transparent to said laser light, and said graphitic form of carbon atoms thereby absorbing said laser light and being ablated from said carbon film.

7. The process of claim 5 or 6 wherein said laser light is generated at a wavelength of greater than or equal to the optical band gap of said aliphatic form of carbon atom.

8. The process of claim 7 wherein said wavelength is greater than or equal to 200 nm.

9. The process of claim 5 or 6 wherein said laser light is generated by a XeCl laser at a wavelength of 308 nm.

10. The process of claim 5 or 6 wherein said laser light is generated by pulsed UV lasers selected from the group consisting of the inert gas/halide excimer laser Krcl (222 nm), KrF (248 nm) and ArF (193 nm).

11. A diamond-like carbon film produced in accordance with the process of claim 1 wherein the diamond-like carbon film has graphitic regions of no more than approximately 1 carbon ring in size.

\* \* \* \* \*